US012622300B1

(12) United States Patent
Nayini et al.

(10) Patent No.: US 12,622,300 B1
(45) Date of Patent: May 5, 2026

(54) METHOD OF ASSEMBLING PARTITIONED ORGANIC SUBSTRATE IN A FLIP CHIP PACKAGE

(71) Applicant: Marvell Asia Pte Ltd, Singapore (SG)

(72) Inventors: Manish Nayini, Wappingers Falls, NY (US); Janak G. Patel, South Burlington, VT (US); Richard S Graf, Gray, ME (US)

(73) Assignee: Marvell Asia Pte Ltd, Singapore (SG)

( * ) Notice: Subject to any disclaimer, the term of this patent is extended or adjusted under 35 U.S.C. 154(b) by 625 days.

(21) Appl. No.: 17/987,149

(22) Filed: Nov. 15, 2022

Related U.S. Application Data

(60) Provisional application No. 63/279,992, filed on Nov. 16, 2021.

(51) Int. Cl.
| | |
|---|---|
| *H01L 23/13* | (2006.01) |
| *H01L 21/48* | (2006.01) |
| *H01L 23/00* | (2006.01) |
| *H01L 23/14* | (2006.01) |
| *H01L 23/485* | (2006.01) |
| *H01L 23/498* | (2006.01) |

(52) U.S. Cl.
CPC .......... *H01L 23/13* (2013.01); *H01L 21/4853* (2013.01); *H01L 23/145* (2013.01); *H01L 23/49833* (2013.01); *H01L 23/49838* (2013.01); *H01L 23/562* (2013.01)

(58) Field of Classification Search
CPC . H01L 23/13; H01L 23/145; H01L 23/49833; H01L 23/49838; H01L 23/562
See application file for complete search history.

(56) References Cited

U.S. PATENT DOCUMENTS

| | | | | |
|---|---|---|---|---|
| 5,583,378 | A * | 12/1996 | Marrs | ..................... H01L 23/24 257/730 |
| 6,362,525 | B1 * | 3/2002 | Rahim | .................. H01L 23/645 361/764 |
| 6,836,011 | B2 * | 12/2004 | Azuma | ................... H01L 23/13 257/734 |
| 7,312,108 | B2 | 12/2007 | Zhao et al. | |
| 8,183,680 | B2 * | 5/2012 | Zhao | ................... H01L 23/3128 257/E23.037 |

(Continued)

OTHER PUBLICATIONS

Dow, "Sylgard 577 Primerless Silicon Adhesive", Technical Data Sheet, pp. 1-5, year 2017.

(Continued)

*Primary Examiner* — Omar F Mojaddedi
(74) *Attorney, Agent, or Firm* — Meitar Patents LTD.; Daniel Kligler

(57) ABSTRACT

An integrated circuit (IC) package comprises: at least two substrate sub-units configured to adjoin each other to form a substrate, each substrate sub-unit comprising electrical traces configured to couple i) to corresponding terminals of an integrated circuit component and ii) to corresponding terminals of an interposer or a printed circuit board; at least one coupler configured to: 1) align the substrate sub-units and 2) join the substrate sub-units together to form the substrate from the at least two substrate sub-units; and, an integrated circuit having terminals and configured to electrically couple to terminals of the substrate formed of at least two substrate sub-units.

10 Claims, 4 Drawing Sheets

(56) References Cited

U.S. PATENT DOCUMENTS

| | | | | |
|---|---|---|---|---|
| 2003/0179549 | A1* | 9/2003 | Zhong ................. | H01L 23/4334 |
| | | | | 257/E23.092 |
| 2013/0075917 | A1 | 3/2013 | Law et al. | |
| 2015/0371951 | A1* | 12/2015 | Yeh ..................... | H01L 23/5384 |
| | | | | 257/774 |
| 2019/0139842 | A1* | 5/2019 | Chen ................... | H01L 23/3121 |

OTHER PUBLICATIONS

Dow, "Dowsil™ SE 4445 CV Gel", Technical Data Sheet, pp. 1-5, year 2020.
Dow, "Semiconductor Packaging Materials Selection Guide", pp. 1-8, year 2016.
Ajinomoto Fine-Techno USA Corporation, "Ajinomoto Build-up Film", datasheet p. 1, Jun. 2021.
Showa Denko, "High Tg glass epoxy multilayer material MCL-E-705G", pp. 1-2, May 27, 2022 https://web.archive.org/web/20220527005714/http://www.hc-showadenko.com.cn/products/pcb/tg_mcl-e-705g/index.html.

* cited by examiner

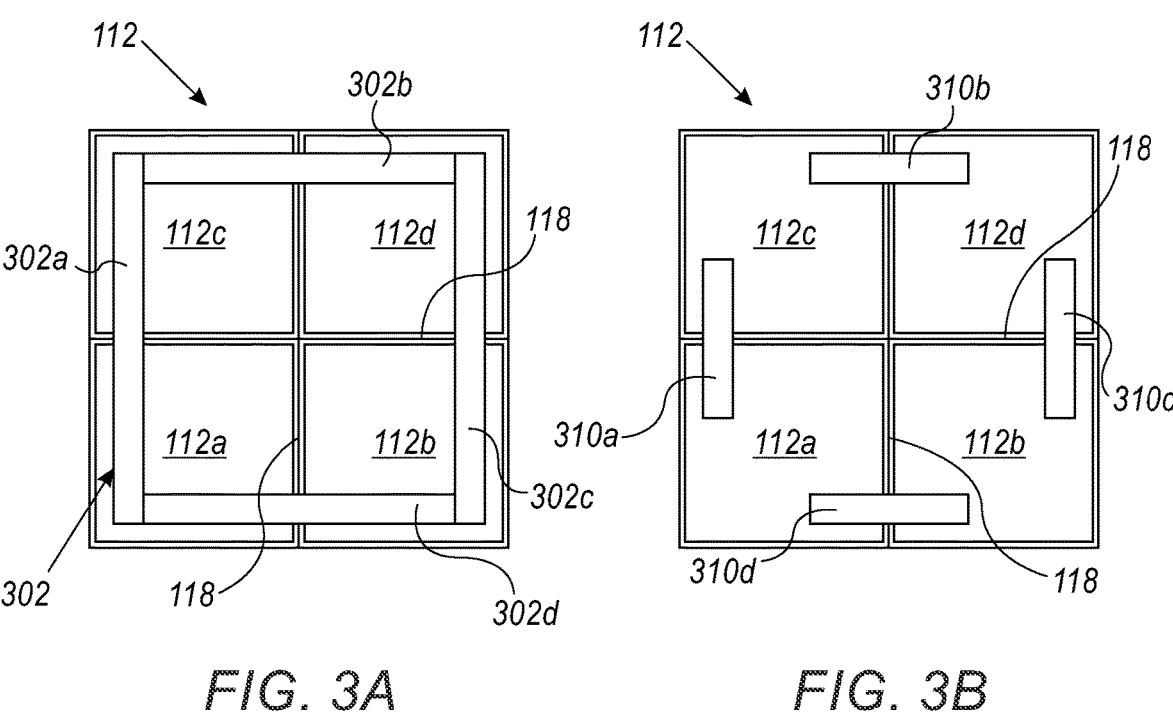
*FIG. 3A*           *FIG. 3B*
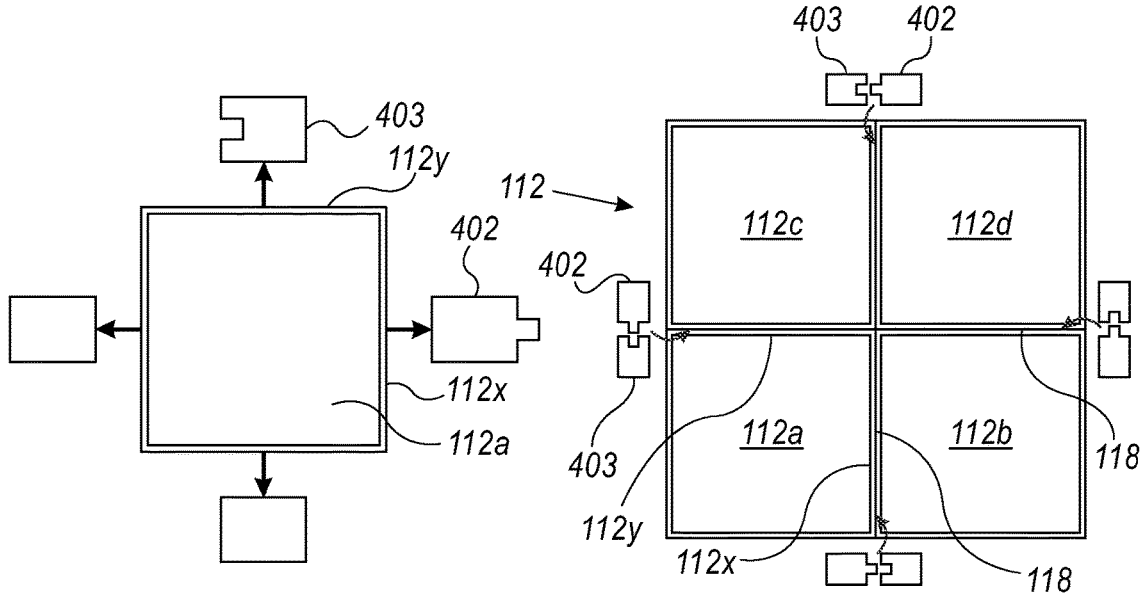
*FIG. 4*

METHOD OF ASSEMBLING PARTITIONED ORGANIC SUBSTRATE IN A FLIP CHIP PACKAGE

CROSS-REFERENCE TO RELATED APPLICATIONS

This application claims the benefit of commonly owned U.S. Provisional Patent Application 63/279,992, entitled: Method of Assembling Partitioned Organic Substrate in a Flip Chip Package, filed Nov. 16, 2021, whose disclosure is incorporated herein in its entirety by reference.

FIELD OF THE DISCLOSURE

The present disclosure relates generally to organic package substrates for integrated circuits (IC), and particularly to methods and systems for producing organic substrates for use, for example, in flip chip IC packages.

BACKGROUND

As technology advances, the need for processing capacity of semiconductor chips and devices increases. Correspondingly, package sizes for chips are getting larger, to handle the increased processing demands. The chips are mounted to organic substrates, whose increasing size results in exponentially increasing material costs, due to yield issues at the panel level.

Additionally, should a large organic substrate fail in pre-assembly tests, it must be rejected. This rejection is a financial loss for the manufacturer, as valuable material and in many instances, scarce material, is wasted.

The description above is presented as a general overview of related art in this field and should not be construed as an admission that any of the information it contains constitutes prior art against the present patent application.

SUMMARY

The present disclosure suggests replacing a single piece large organic substrate for integrated circuit (IC) packaging by multiple smaller substrate sub-units. The sub-units typically are combined prior to or during package assembly. This use of smaller units coupled with combining the units before or during package assembly, provides the combined substrate with the ability to maintain a total number of electrical connections, such as IC bumps and ball grid arrays (BGAs), as the equivalent single piece large organic substrate with multiple smaller units, providing substantial cost savings from use of the smaller units.

The disclosed subject matter is directed to an integrated circuit (IC) package. The IC package comprises: at least two substrate sub-units configured to adjoin each other to form a substrate, each substrate sub-unit comprising electrical traces configured to couple i) to corresponding terminals of an integrated circuit component and ii) to corresponding terminals of an interposer or a printed circuit board; at least one coupler configured to: 1) align the substrate sub-units and 2) join the substrate sub-units together to form the substrate from the at least two substrate sub-units; and, an integrated circuit having terminals and configured to electrically couple to terminals of the substrate formed of at least two substrate sub-units.

Optionally, the IC package is such that the at least one coupler is configured to join the substrate sub-units at a substantially uniform distance from each other, and to electrically isolate the substrate sub-units from each other.

Optionally, the IC package is such that wherein the at least one coupler comprises at least one stabilizing bar configured to be placed between two of the substrate sub-units, and to connect the two of the substrate sub-units and align the two of the substrate sub-units to a common plane.

Optionally, the IC package is such that the at least one coupler comprises at least one stabilizing ring configured to be placed over at least two of the substrate sub-units, and to connect the at least two of the substrate sub-units and to align the at least two of the substrate sub-units to a common plane.

Optionally, the IC package is such that the at least one coupler is made of an electrically insulating material.

Optionally, the IC package is such that the at least one coupler comprises at least one circuit layer that is disposed over least a portion of each of the substrate sub-units, the circuit layer configured to connect the substrate sub-units and align the substrate sub-units to a common plane.

Optionally, the IC package is such that the circuit layer comprises one of (i) a solder-mask layer and (ii) a dummy redistribution layer (RDL).

Optionally, the IC package is such that the at least one coupler includes a mechanical interface on a first substrate sub-unit configured to connect to a mating mechanical interface on a substrate sub-unit, among the substrate sub-units.

Optionally, the IC package is such that the mechanical interface and the mating mechanical interface are configured to connect to one another by a male-female fit.

Optionally, the IC package is such that the mechanical interface and the mating mechanical interface are configured to connect to one another by a tongue and groove fit.

The disclosed subject matter is directed to a method for producing an integrated circuit (IC) package. The method comprises: providing at least two substrate sub-units configured to adjoin each other to form a substrate, each substrate sub-unit comprising electrical traces configured to couple i) to corresponding terminals of an integrated circuit component and ii) to corresponding terminals of an interposer or a printed circuit board; coupling the at least two substrate sub-units including: 1) aligning the substrate sub-units and 2) joining the substrate sub-units together to form the substrate from the at least two substrate sub-units; and, electrically coupling an integrated circuit having terminals and configured to electrically couple to terminals of the substrate formed of at least two substrate sub-units.

Optionally, the method is such that the coupling includes joining the substrate sub-units at a substantially uniform distance from each other, to electrically isolate the substrate sub-units from each other.

Optionally, the method is such that the coupling includes stabilizing the at least two substrate sub-units by placing at least one stabilizing bar between the at least two substrate sub-units, to connect the at least two substrate sub-units and align the at least two substrate sub-units to a common plane.

Optionally, the method is such that the coupling includes stabilizing the at least two substrate sub-units by placing a stabilizing ring over the at least two substrate sub-units, to connect the at least two substrate sub-units and to align the at least two substrate sub-units to a common plane.

Optionally, the method is such that the coupling includes providing at least one circuit layer over at least a portion of each of the at least two substrate sub-units, the circuit layer configured to connect the at least two substrate sub-units and align the at least two substrate sub-units to a common plane.

Optionally, the method is such that the at least one circuit layer comprises one of (i) a solder-mask layer and (ii) a dummy redistribution layer (RDL).

Optionally, the method is such that the coupling at least two substrate sub-units the including connecting a mechanical interface on a first substrate sub-unit to a mating mechanical interface on a substrate sub-unit.

Optionally, the method is such that the mechanical interface and the mating mechanical interface connect by a male-female fit.

Optionally, the method is such that the mechanical interface and the mating mechanical interface connect by a tongue and groove fit.

Throughout this document, references are made to directions, such as top and bottom, and derivatives thereof. These directional references are by way of example only, and are used to explain the disclosed subject matter in example orientations, which are illustrative only, and not limiting in any way.

BRIEF DESCRIPTION OF THE DRAWINGS

Some embodiments of the disclosure are herein described, by way of example only, with reference to the accompanying drawings, where like reference numerals or characters represent corresponding or like elements. Dimensions of components and features shown in the figures are chosen for convenience and clarity of presentation and are not necessarily shown to scale. With specific reference now to the drawings in detail, it is noted that the particulars shown are by way of example and for purposes of illustrative discussion of embodiments of the invention. In this regard, the description taken with the drawings makes apparent to those skilled in the art how embodiments of the invention may be practiced. The drawing figures are as follows.

FIGS. 3A and 3B are diagrams showing a plurality of coupled substrates in accordance with embodiments that are described herein;

FIG. 4 is a diagram showing another coupling of a plurality of substrates in accordance with another embodiment described herein;

DETAILED DESCRIPTION OF EMBODIMENTS

Figures 1, 2:
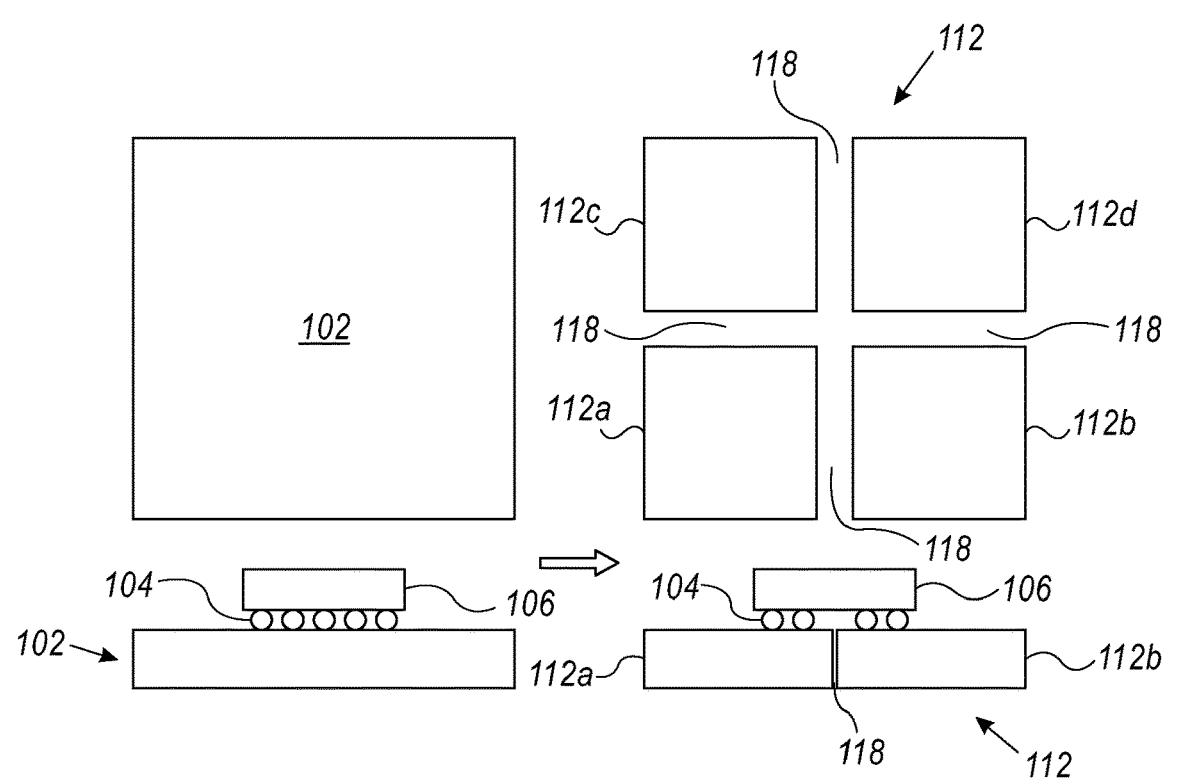
FIG. 1 is a diagram showing the disclosed subject matter in comparison to a conventional one-piece organic substrate.
FIG. 2 is a diagram showing the substrate sub-units in relative disposition to form a panel, in accordance with an embodiment that is described herein.

FIG. 1 shows the presently disclosed subject matter, in which a substrate 112 is formed of substrate sub-units 112a-112d. The substrate 112 mimics and replaces current large single piece organic substrates, such as a single piece or single unit organic substrate 102, in which flip chip IC device 106 such as an IC chip, is illustrated as coupled to a single unit organic package substrate 102. The single unit organic substrate 102 includes traces which correspond to the electrical connections on the substrate 102 for connecting with bumps of flip-chip IC packages, and balls of ball grid arrays (BGA) 104 or interposers. For example, Ball Grid Array (BGA) is commonly referred for package connection to printed circuit boards or interposers, while chip connections to package substrates are typically referred as flip chip bumps (for flip-chip IC packages).

The substrate 112 and substrate sub-units 112a-112d which form it are, for example, organic substrate sub-units. An organic substrate is formed of active and passive layers. Active layers, in which metallic traces and or planar metallic layers disposed, in an example, function to transmit electrical signal input/output (I/O) and/or provide access to a uniform voltage and/or a uniform ground. These layers may include copper lines embedded in a polymeric matrix (resin) and other layers made of pure copper. The passive layers are resin layers, in and embodiment, which electrically insulate the active layers from one another.

As used herein, element number 112 refers to a substrate formed of multiple substrate sub-units 112a-112d units, also referred to as "quadrants". When discussed generally, the quadrants take the element number 112q, and may be any one of substrate sub-units 112a-112d.

The multiple sub-units 112a-112d are coupled together into a substate 112, which may be, for example, a package substrate, by being joined and aligned in accordance with systems and methods of the disclosed subject matter. The joining and alignment of the multiple semiconductor sub-units 112a-112d also accommodate the same or more electrical connections for the BGA 104, as for the single unit organic substrate 102. Also, the joining and alignment of the substrate sub-units 112a-112d is such that each of the substrate subunits 112a-112d is spaced apart from each neighboring substrate sub-unit 112a-112d, a predetermined distance, for example, represented by the gap 118 between substrate sub-units 112a, 112b. The gaps 118 extend along the length of the edges of the neighboring substrate sub-units 112a-112d at the predetermined distance, which, for example, is at least a substantially uniform distance, and typically a uniform distance, such that the neighboring substrate sub-units 112a-112b are electrically isolated from each other.

The electrical isolation between the substrate sub-units 112a-112d is present by design, as all circuitry (e.g., electrical traces), in each substrate sub-unit 112a-112d is within the boundary of each respective substrate sub-unit 112a-112d, and no electrical traces or vias are exposed or otherwise protruding from the substrate sub-units 112a-112d, after being coupled to form the substrate 112. The design, is based, for example, on design rules, which establish a keep out zone at the perimeter of each substrate sub-unit 112a-112d so that after coupling, there is not any exposed circuitry at the edge along the perimeter, of each substrate sub-unit 112a-112d.

Within each substrate sub-unit 112a-112d, there are disposed electrical traces and corresponding electrical connections. These electrical connections receive a portion of the balls of the BGA 104, in a manner similar to that of the single unit organic substrate 102.

The multiple substrate sub-units 112a-112d, by virtue of their smaller size, typically cost much less in comparison to a single unit large substrate, such as the substrate 102. For example, should a smaller substrate sub-unit 112a-112d fail testing, only the failed substrate sub-unit 112a-112d needs to be replaced with a corresponding smaller substrate sub-unit. This replacement is significantly less costly than having to reject the single unit large substrate 102. The use of the smaller substrate sub-units improves yield, as less material is potentially rejected, and hence, wasted. Also, the possibility for substrate sub-unit warpage, based on the smaller size of the sub-units 112a-112d, is significantly decreased when compared to the single-piece large substrate 102.

While a substrate 112 formed of sub-units defining quadrants (i.e., substrate sub-units 112a-112d) are shown, this is by way of example only. The substrate 112 may also be formed from as few as two substrate sub-units, three sub-units, or more than four substrate sub-units.

As shown in FIG. 2, the individual quadrants 112q, alone, or as joined in a group to form substrates, or combinations thereof, may be incorporated into larger structures, such as a panel 200.

FIGS. 3A and 3B show substrate sub-units 112a-112d adjoined to form a substrate 112. The substrate sub-units 112a-112d are joined or otherwise connected by a coupler including, for example, a stiffener or stabilizing 302, ring formed of stiffening or stabilizing bars 302a-302d (FIG. 3A), and a substrate 112 formed of substrate sub-units 112a-112d, joined by couplers, including, for example, stiffener or stabilizing bars 310a-310d (FIG. 3B). Both the stiffener ring 302 bars 302a-302d and the stiffener bars 310a-310d maintain and stabilize neighboring substrate sub-units 112a-112d joined together and in alignment, for example, alignment to, or otherwise along, a common plane, so as to be spaced apart from each other by a uniformly distanced gap 118. The gap 118 is of a distance such that the neighboring sub-units 112a-112b (sub-units 112c and 112d of the substrate 112 not shown) remain electrically isolated from each other. Each stiffener ring bar 302a-302d and stiffener bar 310a-310d is, for example, positioned to extend proximate to the periphery of two adjacent sub-units 112a-112d, and, for example, joins the two adjacent sub-units 112a-112d.

The stiffener ring bars 302a-302d and stiffener bars 310a-310d are made of materials, for example, Nickel (Ni)-plated copper or Stainless Steel, and are attached to the sub-units 312a-312d by non-electrically conductive and/or electrically insulating materials, such as adhesives, for example, Sylgard™ 577 Primerless Silicon Adhesive from The Dow Chemical Company of Midland, Michigan USA, DOW-SIL™ SE4445 CV and DOWSIL™ EA6900 Adhesive, both from the Dow Chemical Company of Midland, Michigan USA. For example, the stiffener ring 302 is formed on the substrate sub-units 112a-112d, prior to a chip or device join. Alternately, the stiffener ring 302 may be formed on the substrate sub-units 112a-112d, joining them after chip or device joining. This is also the case for the stiffener bars 310a-310d.

Alternately, the stiffener ring 302 may be formed of stiffener ring bars 302a-302d, which are, for example, modular bars, of multiple shapes, for example, straight, rounded, angled, or combinations thereof, such that the stiffener ring 302 is of shapes including, for example, rectangular, circular, oval, triangular, and the like. The stiffener ring 302, may also be a unitary member, in shapes including, for example, rectangular, circular, oval, triangular, and the like. While four stiffener ring bars 302a-302d are shown to form the stiffener ring 302, any number of stiffener ring bars may be used to form the stiffener ring 302, provided the substrate sub-units are coupled, so as to be joined in alignment with the gap 118 between neighboring sub-units. While a single stiffener ring 302 is shown, multiple rings and/or additional bars may also be used.

Alternately, the stiffener bars 310a-310d may be of multiple shapes, for example, straight, rounded, angled, or combinations thereof. Additionally, multiple bars may be used to join neighboring sub-units.

Alternately, a lidded package may be made for the joined substrate sub-units 112a-112d for the substrates 112 of FIGS. 3A and 3B. The lidded package includes a flat plate (not shown), which is joined over the stiffener ring 302 or stiffener bars 310a-310d, typically after chip or device join. Adding the lid typically prevents warpage during substrate solder ball (BGA) attach reflow of the substrates 112. Additionally, the lid may be integral with the stiffener ring 302 or stiffener bars 301a-310d. For example, a one-piece lid may include a stiffener ring 302 or bars 310a-310d as lid feet, and a flat portion of the lid is integrated in the lid manufacturing process.

FIG. 4 shows another embodiment in which a substrate 112, formed of sub-units 112a-112d, with neighboring sub-units joined or are otherwise connected by a coupler, including, for example, a mechanical interface 402 and a mating mechanical interface 403. The mating mechanical interface 402 and mating mechanical interface 403 maintain neighboring substrate sub-units 112a-112d joined or connected together and in alignment, so as to be spaced apart from each other by a uniformly distanced gap 118, as detailed above. The mating mechanical interface 402 and mating mechanical interface 403 are positioned along a first side 112x of a sub-unit 112a-112d, and along an adjacent or second side 112y, of the respective sub-unit 112a-112d.

Alternately, the substrate sub-units 112a-112d may be in contact with each other, for example, in the substrate 112 of FIG. 4. this situation, the substrate sub-units 112a-112d have their electrical traces or vias a minimum distance from the edge of the respective substrate sub-unit 112a-112d, such that there are not any conducting structures exposed at the edge of the substrate sub-units 112a-112d.

The mating mechanical interface 402 and mating mechanical interface 403 include, for example, a male-female fit, a tongue and groove fit or any other suitable mating configuration. The mating mechanical interface 402 and mating mechanical interface 403 are, for example, formed of a non-conductive and/or electrically insulating material, such plastic, r example, dielectric core material (E705G), of the substrate 112 for the tongue portion 402, and dielectric build up material (GL102F) of the substrate 112 for the groove portion 403. Both the tongue portion 402 and the groove portion 403 are integral parts of substrate design and fabrication processes, and are attached to each respective sub-unit 112a-112d on the same side of the sub-unit 112a-112d.

For example, for the coupling which uses tongue and groove mechanical interface (e.g., tongue) 402 and mating mechanical interface (e.g., groove) 403, each quadrant includes a tongue interface (along a side 112x) and a groove interface (along a side 112y), along adjacent sides. This interface engagement results, for example, in a friction fitting engagement of mating tongue 402 or groove 403 structures on mating sides of adjacent quadrants, e.g., substrate sub-units 112a-112d. In other configurations, the tongue 402 and grove 403 may be structured to mutually interlock adjacent substrate sub-units 112a-112d.

Once quadrants, e.g., sub-units 112a-112d, are suitably joined to form the substrate 112, the substrate 112 may be used like that of a traditional build up substrate through assembly. Major process steps include, for example, chip join, e.g., reflow of the bumped semiconductor chip to the substrate 112, underfill, capacitor attach, lid attach and ball grid array (BGA) attach.

Figure 5:
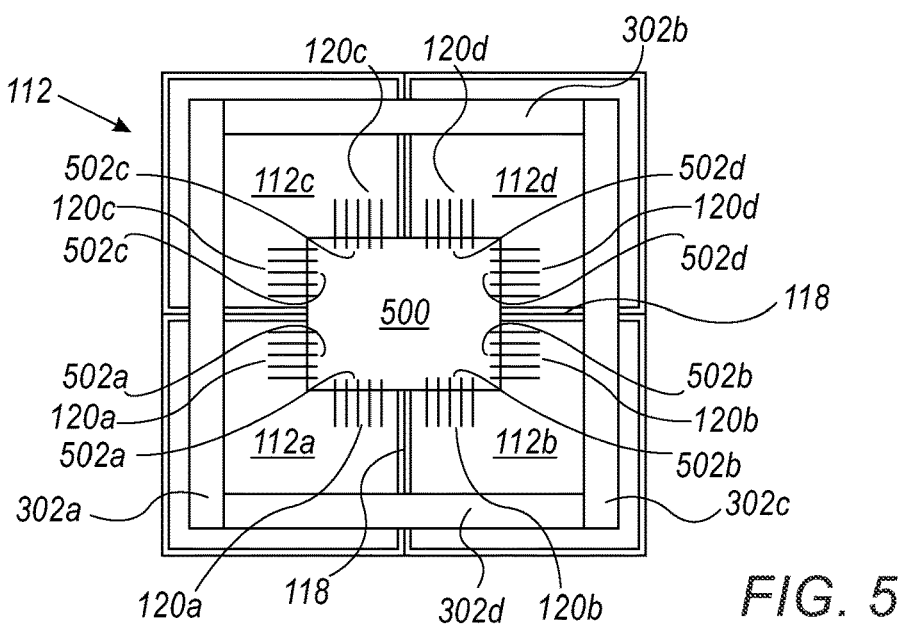
FIG. 5 is a diagram showing the substrate of FIG. 3A in operation with an IC device.

FIG. 5 shows an example substrate 112 formed of quadrants, e.g., sub-units 112a-112d, operating as a substrate 112 with a device 500, such as an integrated circuit (IC), for example as an IC package (e.g., a flip-chip IC package), chip, ball grid array (BGA) or the like. For each sub-unit 112a-112d, electrical traces 120a-120d were applied when each quadrant was manufactured. The traces 120a-120d on each quadrant 112a-112d correspond to the electrical connections 502a-502d on the corresponding quarter of the device 500. Accordingly, the traces on each quadrant must be planned in advance so that upon manufacturing substrate 112 formed of sub-units 112a-112d can accommodate each specific device which will be used with the package substrate, formed by the quadrants. For example, the traces terminate in pads on each respective quadrant 112a-112d, which are joined to bumps or terminals on a corresponding quarter (e.g., corner) of the IC, or balls on a corresponding quarter of a BGA.

Additionally, in package substrates, fan outs are, for example, within individual sub-units 112a-112d, such that interconnects with the device 500 allow for crossing over of fan-outs. As a result, the fan outs are within each substrate sub-unit 112a-112d, and any cross-over only occurs in the device 500, such as an IC or BGA. For example, design rules for the substrate sub-units 112a-112d, of the disclosed subject matter, are the same as if the sub-units 112a-112d were designed as the single piece organic substrate 102, detailed above.

Figure 6A:
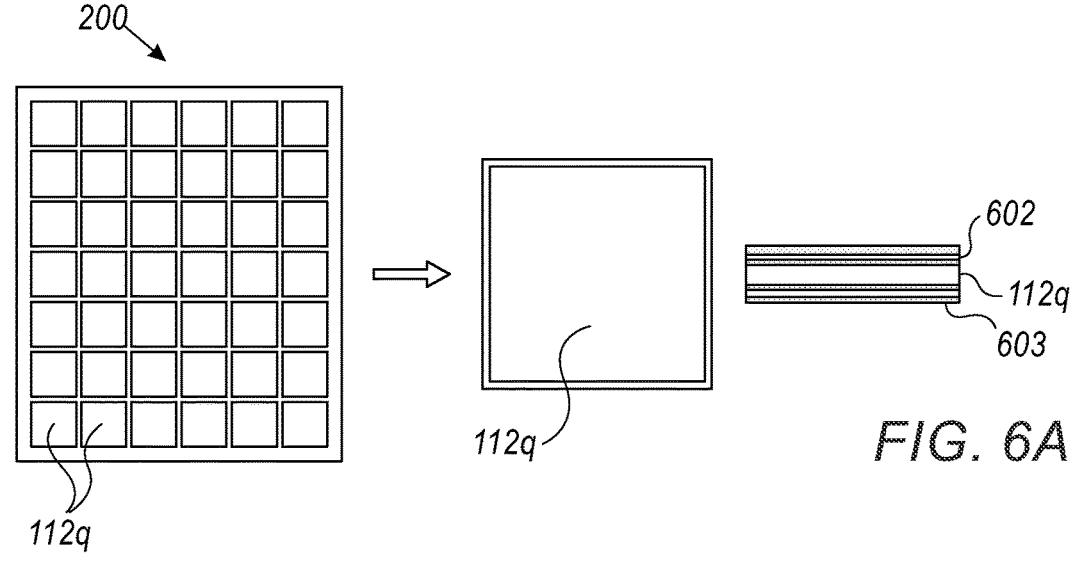
FIGS. 6A and 6B show a process for forming a substrate from substrate sub-units, in accordance with an embodiment that is disclosed herein.
Figure 6B:
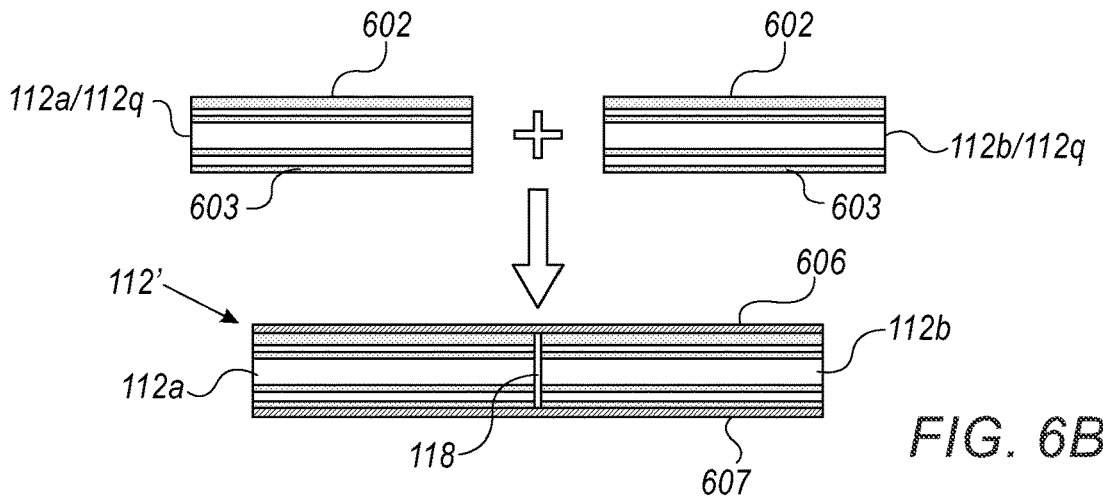

FIGS. 6A and 6B show a process where the quadrants 112q (112a-112d) are electrically coupled to each other, via the traces being coupled by an additional layer or process plate on the top 606 and bottom 607 of the joined substrate sub-units 112a-112d (FIG. 6B). The process plates 606, 607 provide for electrical conductivity between electrical traces on the individual substrate sub-units 112a-112d. This electrical coupling is in addition to the mechanical coupling.

In FIG. 6A a quadrant 112q, e.g., sub-unit 112a, representative of the other quadrants, e.g., sub-units 112b-112d, is processed, for example, by adding metal layers 602, 603 on the top and bottom of the sub-unit 112a, for example, without a solder mask.

Turning also to FIG. 6B, with the quadrants, e.g., sub-units 112a-112d (112c and 112d not shown) aligned, into an aligned unit or substrate 112' having a common plane, a solder mask on the aligned unit is processed, to create a process plate 606 on top surface of the aligned unit (of sub-units 112a-112d), and typically, a process plate 607 on the bottom surface of the aligned unit. Additional process plates may be added, with the building of the substrate 112' from the center outward.

The process plates 606, 607 serve as couplers, for example, in the form of a circuit layer. The circuit layer electrically connects to the traces of the individual quadrants, and mechanically connects (joins) the quadrants, e.g., substrate sub-units 112a-112d, and aligns the substrate sub-units 112a-112d along a common plane, for example, maintaining a gap 118 between neighboring sub-units 112a-112d. The circuit layer may be, for example, a solder mask layer, or a dummy redistribution layer (RDL). For example, the circuit layer, of a solder mask layer or a dummy RDL, may be either uniform or non-uniform.

Figure 7:
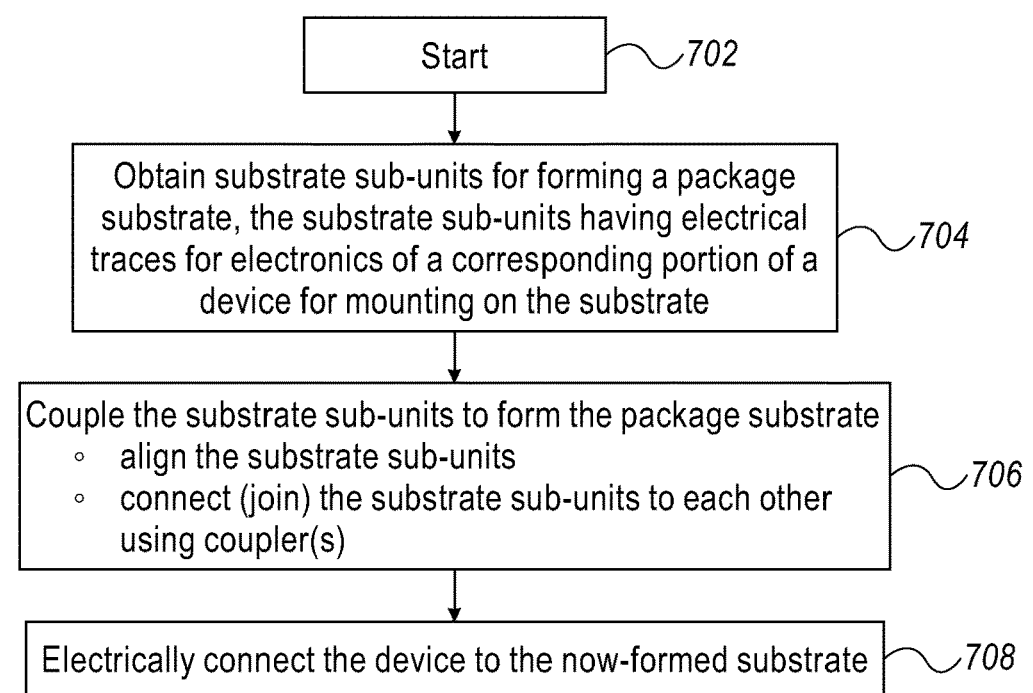
FIG. 7 is a flow diagram of an example process for producing the substrates of FIGS. 3A, 3B, and 4, with the device of or similar to that of FIG. 5.

FIG. 7 is a flow diagram for of an example process for producing the substrates 112 with the device 500. Reference is made to FIGS. 3A, 3B, 4 and 5.

The process begins at a START block 702.

The process moves to block 704, where substrate sub-units 112a-112d, e.g., quadrants, are obtained, for forming a package substrate 112. For example, each of the sub-units 112a-112d is such that it includes electrical traces for electronics of a corresponding portion (e.g., quarter) of a device 500, for mounting on the substrate 112.

At block 706, the sub-units 112a-112d (e.g., quadrants) are coupled to form the package substrate or substrate 112. The coupling includes aligning the substrate sub-units 112a-112d to the desired substrate 112 shape, such as square or rectangular. The alignment, for example, includes placing each neighboring sub-unit 112a-112d at a constant distance from each other to have a uniform or substantially uniform gap 118 between the neighboring substrate sub-units 112a-112d, to electrically isolate neighboring sub-units 112a-112d from each other.

The gap 118 between neighboring substrate sub-units 112a-112d, for example, is intentional, so that the pads on the top surface of the substrate sub-units 112a-112d, and pads on bottom surface of substrate sub-units 112a-112d are maintained at a predetermined final or complete product substrate distance. The gap 118 is adjustable to account for process variations in manufacturing the substrate sub-units 112a-112d. The alignment is followed by connecting (joining) the aligned substrate sub-units 112 to each other. The couplers include, for example, a stiffener ring 302, stiffener bars 310a-310d, or mechanical interfaces 402 and corresponding mating mechanical interfaces 403.

The process moves to block 708, where a device 500 is electrically connected to the now-formed substrate 112. The electrical connection depends on the type of device 500, for example, an IC.

Figure 8:
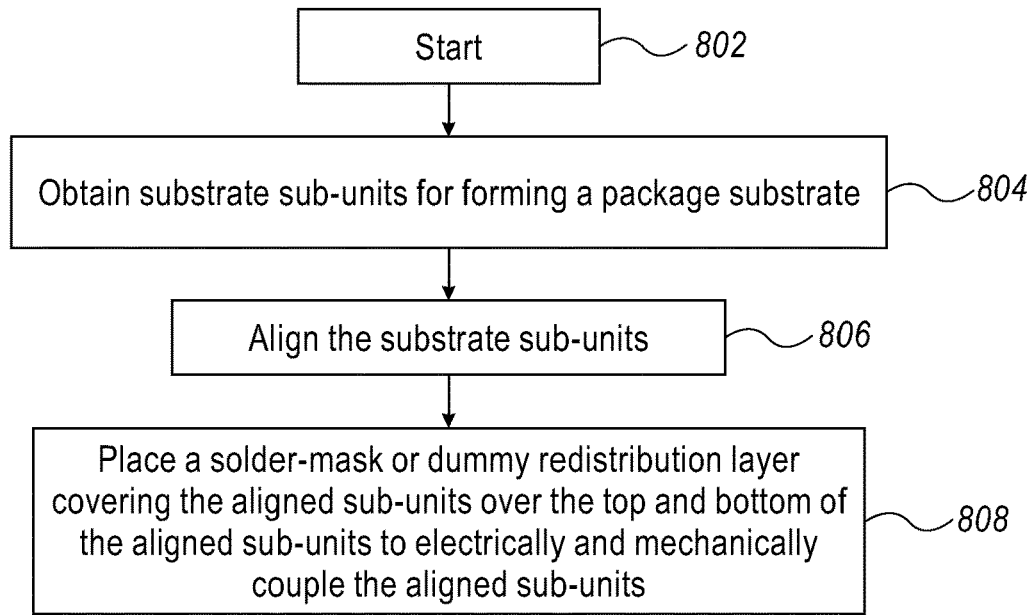
FIG. 8 is a flow diagram of an example process for producing the substrate as detailed in FIGS. 6A and 6B.

FIG. 8 is a flow diagram for of an example process for producing the substrate 112' of FIGS. 6A and 6B, to which reference is also made.

The process begins at a START block 802.

The process moves to block 804, where substrate sub-units 112a-112d, e.g., quadrants, are obtained, for forming a substrate 112'. For example, each of the sub-units 112a-112d may include metal layers 602, 603 added on the top and bottom of the sub-unit 112a (as representative of sub-units 112a-112d).

The process moves to block 806, where the sub-units 112a-112d are aligned to the desired substrate 112' shape, such as square or rectangular. The alignment, for example, includes placing each neighboring sub-unit 112a-112d at a constant distance from each other to have a uniform or substantially uniform gap 118 between the neighboring sub-units 112a-112d, to electrically isolate the sub-units 112a-112d from each other.

The process moves to block 808, where a circuit layer 606, 607, for example, a solder-mask or dummy redistribution layer (RDL) (e.g., 1-1 redistribution), is placed over the aligned sub-units 112a-112d along the top and bottom surfaces of the aligned sub-units 112a-112d. The circuit layers 606, 607 electrically and mechanically couple the aligned sub-units 112a-112d of the substrate 112'.

It is noted that the embodiments described above are cited by way of example, and that the present disclosure is not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art.

The invention claimed is:

1. An integrated circuit (IC) package, comprising:
   an integrated circuit device having first terminals;

at least two substrate sub-units configured to adjoin each other to form a substrate, each substrate sub-unit comprising electrical traces configured to couple i) to one or more of the first terminals of the integrated circuit device and ii) to second terminals of an interposer or a printed circuit board; and at least one coupler configured to: 1) align the substrate sub-units and 2) join the substrate sub-units together to form the substrate from the at least two substrate sub-units, wherein the integrated circuit device is configured to electrically couple via the first terminals to third terminals of the substrate formed of the at least two substrate sub-units.

2. The IC package of claim 1, wherein the at least one coupler is configured to join the at least two substrate sub-units at a substantially uniform distance from each other, and to electrically isolate the at least two substrate sub-units from each other.

3. The IC package of claim 1, wherein the at least one coupler comprises at least one stabilizing bar configured to be placed between first and second substrate sub-units among the at least two of the substrate sub-units, and to connect the first and second substrate sub-units and align the first and second substrate sub-units to a common plane.

4. The IC package of claim 1, wherein the at least one coupler comprises at least one stabilizing ring configured to: be placed over the at least two substrate sub-units, connect the at least two substrate sub-units, and align the at least two substrate sub-units to a common plane.

5. The IC package of claim 1, wherein the at least one coupler is made of an electrically insulating material.

6. The IC package of claim 1, wherein the at least one coupler comprises at least one circuit layer that is disposed over at least a portion of each of the at least two substrate sub-units, the circuit layer configured to connect the at least two substrate sub-units and align the at least two substrate sub-units to a common plane.

7. The IC package of claim 6, wherein the at least one circuit layer comprises one of (i) a solder-mask layer and (ii) a dummy redistribution layer (RDL).

8. The IC package of claim 1, wherein the at least two substrate sub-units comprise a first substrate sub-unit and a second substrate sub-unit, and wherein the at least one coupler includes a mechanical interface on the first substrate sub-unit, the mechanical interface being configured to connect to a mating mechanical interface on the second substrate sub-unit.

9. The IC package of claim 8, wherein the mechanical interface and the mating mechanical interface are configured to connect to one another by a male-female fit.

10. The IC package of claim 8, wherein the mechanical interface and the mating mechanical interface are configured to connect to one another by a tongue and groove fit.

*   *   *   *   *